(12) United States Patent
Seto et al.

(10) Patent No.: US 11,094,731 B2
(45) Date of Patent: Aug. 17, 2021

(54) IMAGE CAPTURING DEVICE AND CAMERA

(71) Applicant: CANON KABUSHIKI KAISHA, Tokyo (JP)

(72) Inventors: Daichi Seto, Yokohama (JP); Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/272,065

(22) Filed: Feb. 11, 2019

(65) Prior Publication Data

US 2019/0259801 A1 Aug. 22, 2019

(30) Foreign Application Priority Data

Feb. 19, 2018 (JP) .............................. JP2018-027248

(51) Int. Cl.
*H01L 27/146* (2006.01)
*H01L 31/02* (2006.01)
*H01L 31/18* (2006.01)

(52) U.S. Cl.
CPC .... *H01L 27/14643* (2013.01); *H01L 27/1461* (2013.01); *H01L 27/1463* (2013.01); (Continued)

(58) Field of Classification Search
CPC . H01L 27/146; H01L 27/14601–14609; H01L 27/14612; H01L 27/14614; H01L 27/14616; H01L 27/14641; H01L 27/14656; H01L 27/14661; H01L 27/14663; H01L 27/14625; H01L 27/14678; H01L 27/14689; H01L 27/14603; H01L 27/14643; H01L 27/1463; H01L 27/1461; H01L 27/14679
(Continued)

(56) References Cited

U.S. PATENT DOCUMENTS 8,174,057 B2 * 5/2012 Lee .................. H01L 27/14689
257/262
8,648,944 B2 2/2014 Iwata
(Continued)

FOREIGN PATENT DOCUMENTS

JP 2007-134639 A 5/2007

*Primary Examiner* — Natalia A Gondarenko
(74) *Attorney, Agent, or Firm* — Venable LLP

(57) ABSTRACT

An image capturing device is provided. The device comprises a photodiode including a first semiconductor region of a first conductivity type and a second semiconductor region of a second conductivity type, a third semiconductor region of the second conductivity type, an insulator arranged between the photodiode and the third semiconductor region and a channel stop region of the first conductivity type which covers a side and a bottom surface of the insulator. The channel stop region includes a fourth semiconductor region arranged between the insulator and the second semiconductor region and a fifth semiconductor region arranged between the insulator and the third semiconductor region. An impurity concentration in the fourth semiconductor region is higher than an impurity concentration in the fifth semiconductor region and the impurity concentration in the fifth semiconductor region is not less than an impurity concentration in the first semiconductor region.

20 Claims, 8 Drawing Sheets

(52) U.S. Cl.
CPC .. *H01L 27/14603* (2013.01); *H01L 27/14612* (2013.01); *H01L 27/14679* (2013.01)

(58) Field of Classification Search
USPC .......................... 257/432, 443, 292, 291, 446
See application file for complete search history.

(56) References Cited

U.S. PATENT DOCUMENTS

| | | | |
|---|---|---|---|
| 8,697,500 | B2 | 4/2014 | Iwata |
| 9,543,340 | B2 | 1/2017 | Iwata |
| 9,979,916 | B2 | 5/2018 | Hiyama et al. |
| 10,121,816 | B2 | 11/2018 | Iwata |
| 2001/0032983 | A1 | 10/2001 | Miyagawa et al. |
| 2003/0160295 | A1 | 8/2003 | Okita |
| 2006/0038254 | A1* | 2/2006 | Jin .................... H01L 27/14689 257/510 |
| 2011/0136291 | A1 | 6/2011 | Iwata et al. |
| 2013/0153976 | A1* | 6/2013 | Honjo ..................... H01L 31/02 257/291 |
| 2015/0333100 | A1* | 11/2015 | Ahn .................. H01L 27/14603 257/292 |
| 2016/0064428 | A1* | 3/2016 | Nakamura ........ H01L 27/14689 257/465 |
| 2018/0350861 | A1* | 12/2018 | Kunikiyo .......... H01L 27/14623 |
| 2018/0374886 | A1 | 12/2018 | Iwata et al. |

\* cited by examiner

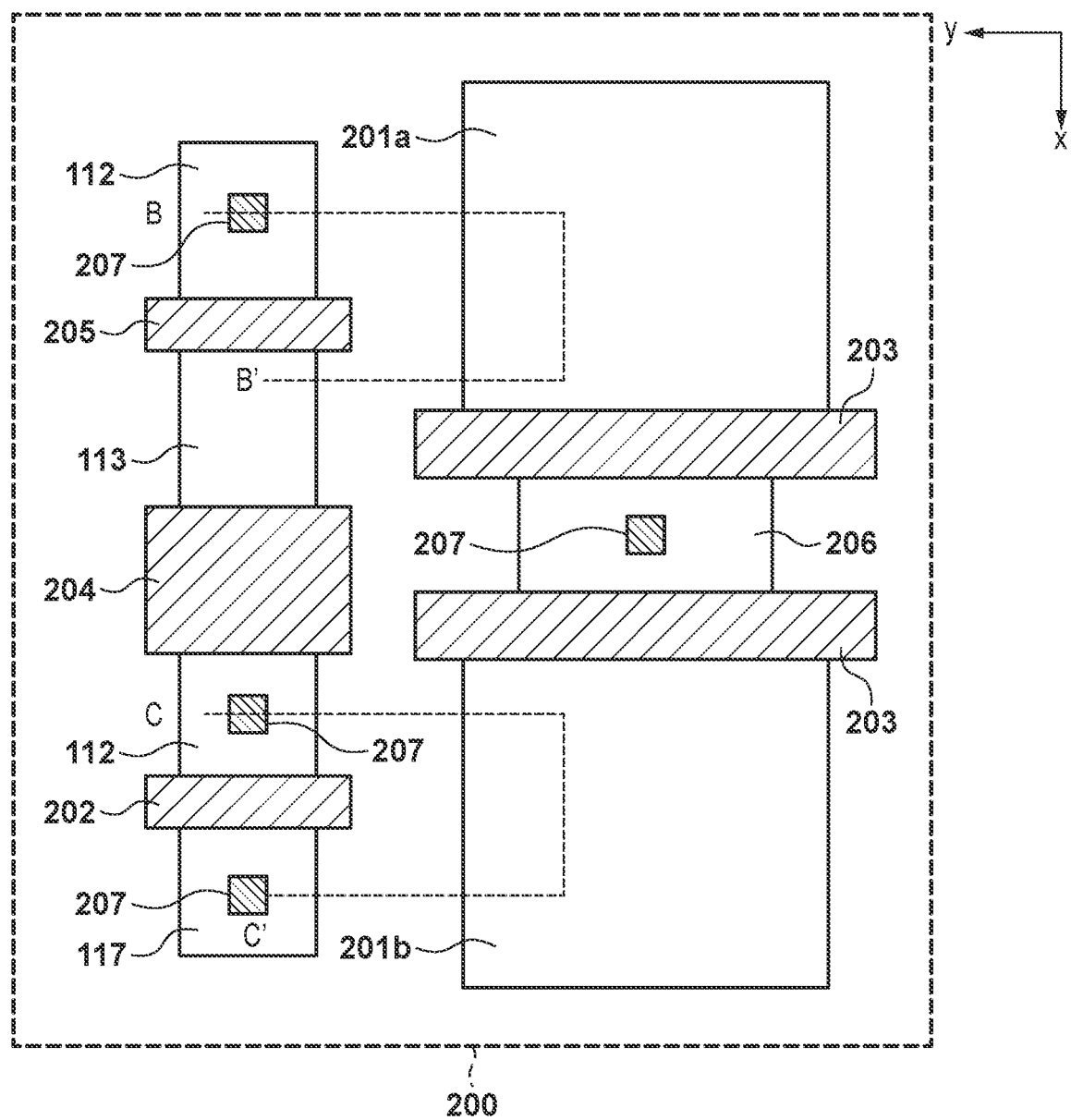

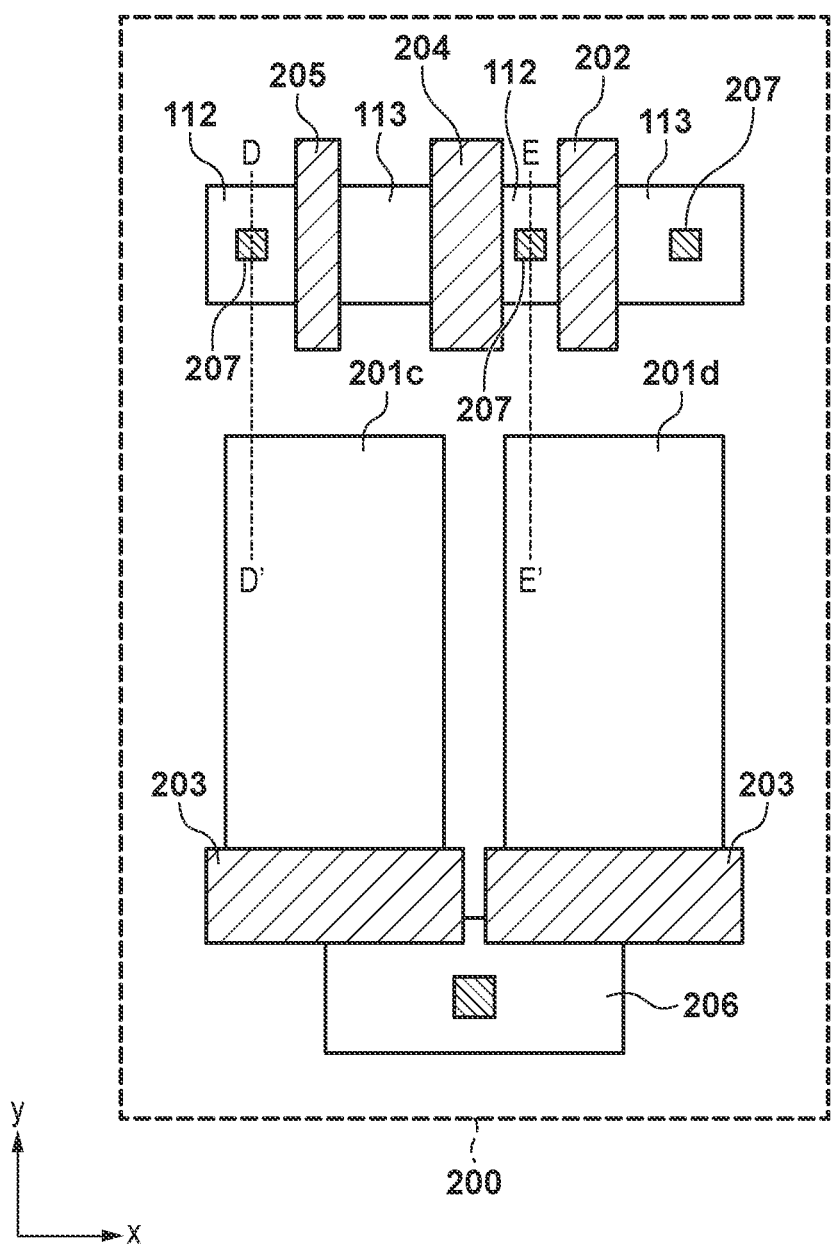

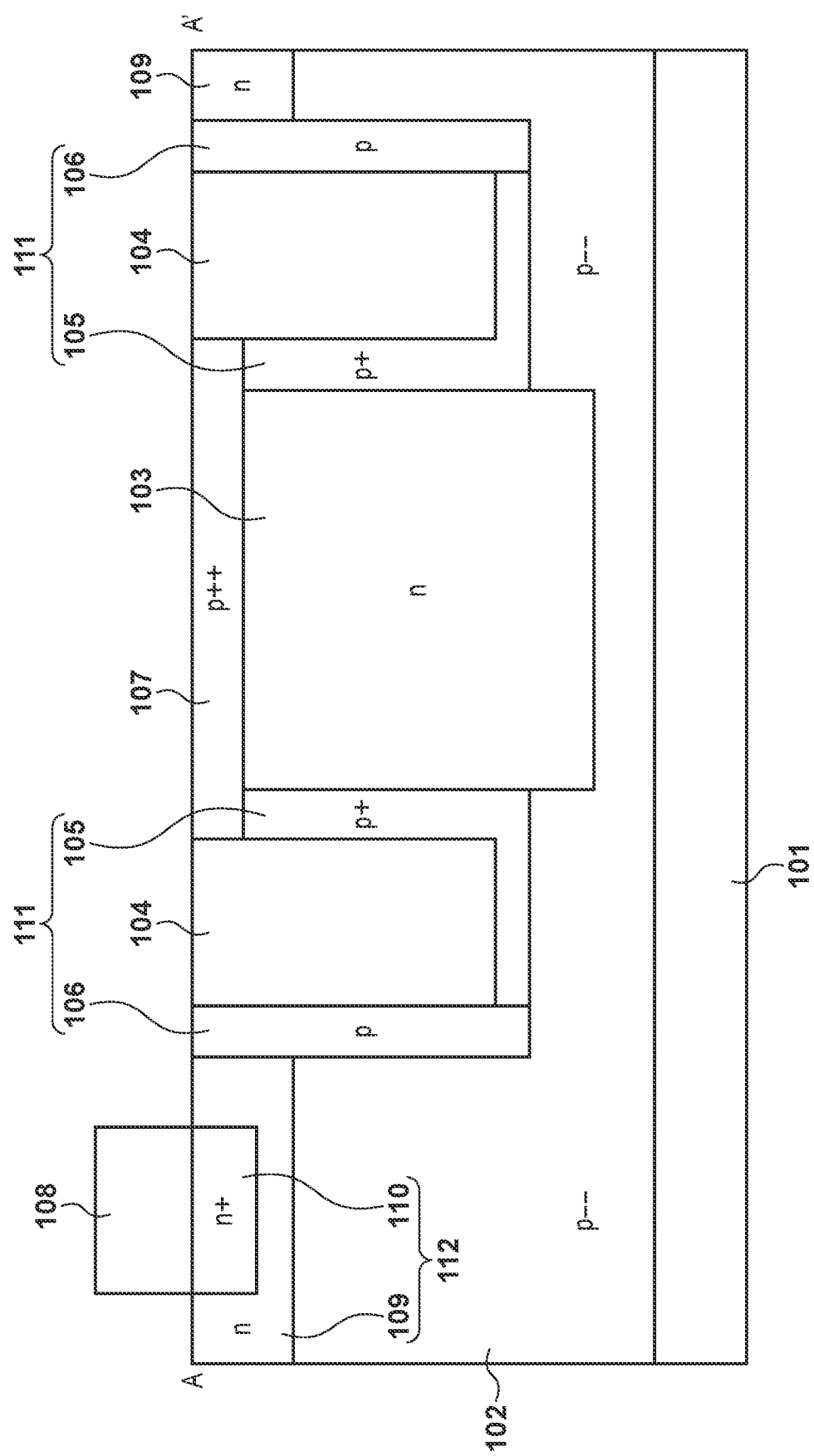

IMAGE CAPTURING DEVICE AND CAMERA

BACKGROUND OF THE INVENTION

Field of the Invention

The present invention relates to an image capturing device and a camera.

Description of the Related Art

There is known an image capturing device including a plurality of photodiodes arranged on a semiconductor substrate. Between each photodiode and a semiconductor element such as a transistor adjacent to the photodiode, an insulating film is arranged as an element isolation region used to electrically isolate the photodiode and the semiconductor element from each other. Japanese Patent Laid-Open No. 2007-134639 shows providing a channel stop region containing a p-type impurity at a concentration higher than in a p-type semiconductor region to cover the side and bottom surfaces of an embedded insulating film embedded in the p-type semiconductor region. When the channel stop region is arranged to cover the side surfaces of the embedded insulating film, a flow of a dark current generated in the interface between the embedded insulating film and the semiconductor region into the photodiode can be suppressed.

SUMMARY OF THE INVENTION

In a semiconductor element such as a transistor arranged next to a photodiode with the intervention of an element isolation region, an n-type region containing an n-type impurity at a high concentration such as a source/drain region configured to form an ohmic contact to a wiring line made of a metal or polysilicon is arranged. If the strength of an electric field generated between a p-type channel stop region covering an embedded insulating film and the n-type region of the high concentration increases along with the miniaturization of the element or the like, dark electrons generated in the interface between the embedded insulating film and the semiconductor region readily cause impact ionization. When the dark electrons cause the impact ionization and flow into the photodiode, a white defect is formed, and the quality of an obtained image decreases.

Some aspects of the present invention provide a technique of suppressing a white defect derived from an electric field generated between a channel stop region and a semiconductor element while suppressing a flow of a dark current generated in the interface between an embedded insulating film and a semiconductor layer into a photodiode.

According to some embodiments, an image capturing device comprising: a photodiode including a first semiconductor region of a first conductivity type, and a second semiconductor region of a second conductivity type opposite to the first conductivity type, which are arranged on a substrate; a third semiconductor region of the second conductivity type; an embedded insulating film arranged between the photodiode and the third semiconductor region in an orthogonal projection to an obverse surface of the substrate; and a channel stop region of the first conductivity type which covers a side surface and a bottom surface of the embedded insulating film, wherein the channel stop region includes a fourth semiconductor region arranged between the embedded insulating film and the second semiconductor region, and a fifth semiconductor region arranged between the embedded insulating film and the third semiconductor region, an impurity concentration of the first conductivity type in the fourth semiconductor region is higher than an impurity concentration of the first conductivity type in the fifth semiconductor region, and the impurity concentration of the first conductivity type in the fifth semiconductor region is not less than an impurity concentration of the first conductivity type in the first semiconductor region, is provided.

Further features of the present invention will become apparent from the following description of exemplary embodiments (with reference to the attached drawings).

BRIEF DESCRIPTION OF THE DRAWINGS

FIG. 4 is a plan view showing an example of the structure of a unit cell of an image capturing device according to another embodiment of the present invention;

FIG. 6 is a plan view showing an example of the structure of a unit cell of an image capturing device according to still another embodiment of the present invention;

FIG. 8 is a sectional view showing a modification of the structure of the image capturing device shown in FIG. 1.

DESCRIPTION OF THE EMBODIMENTS

Figure 1:
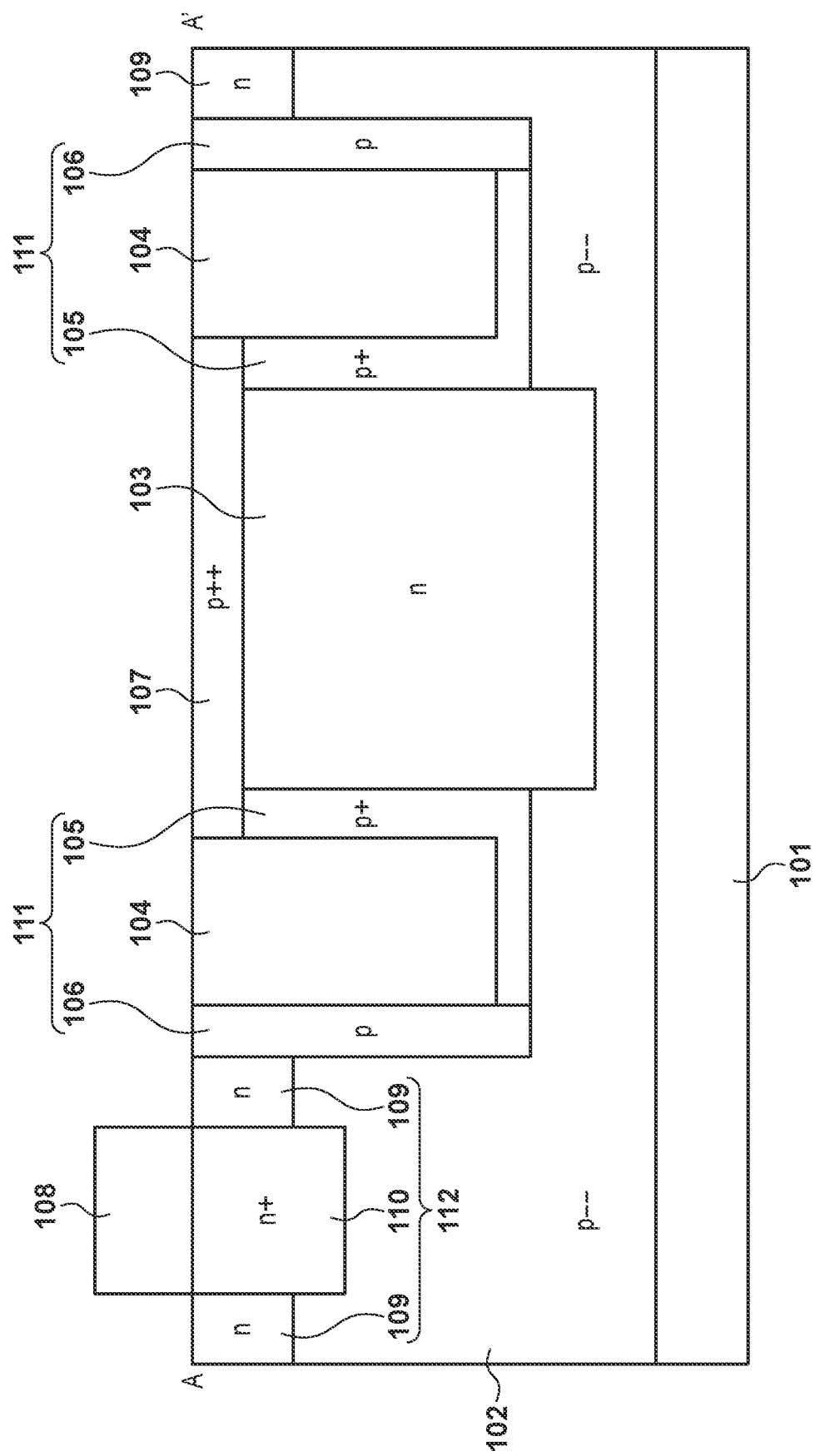
FIG. 1 is a sectional view showing an example of the structure of an image capturing device according to an embodiment of the present invention.

Detailed embodiments of an image capturing device according to the present invention will now be described with reference to the accompanying drawings. Note that in the following description and drawings, common reference numerals denote common components throughout a plurality of drawings. Hence, the common components will be described by cross-referring to the plurality of drawings, and a description of components denoted by common reference numerals will appropriately be omitted.

Figure 2:
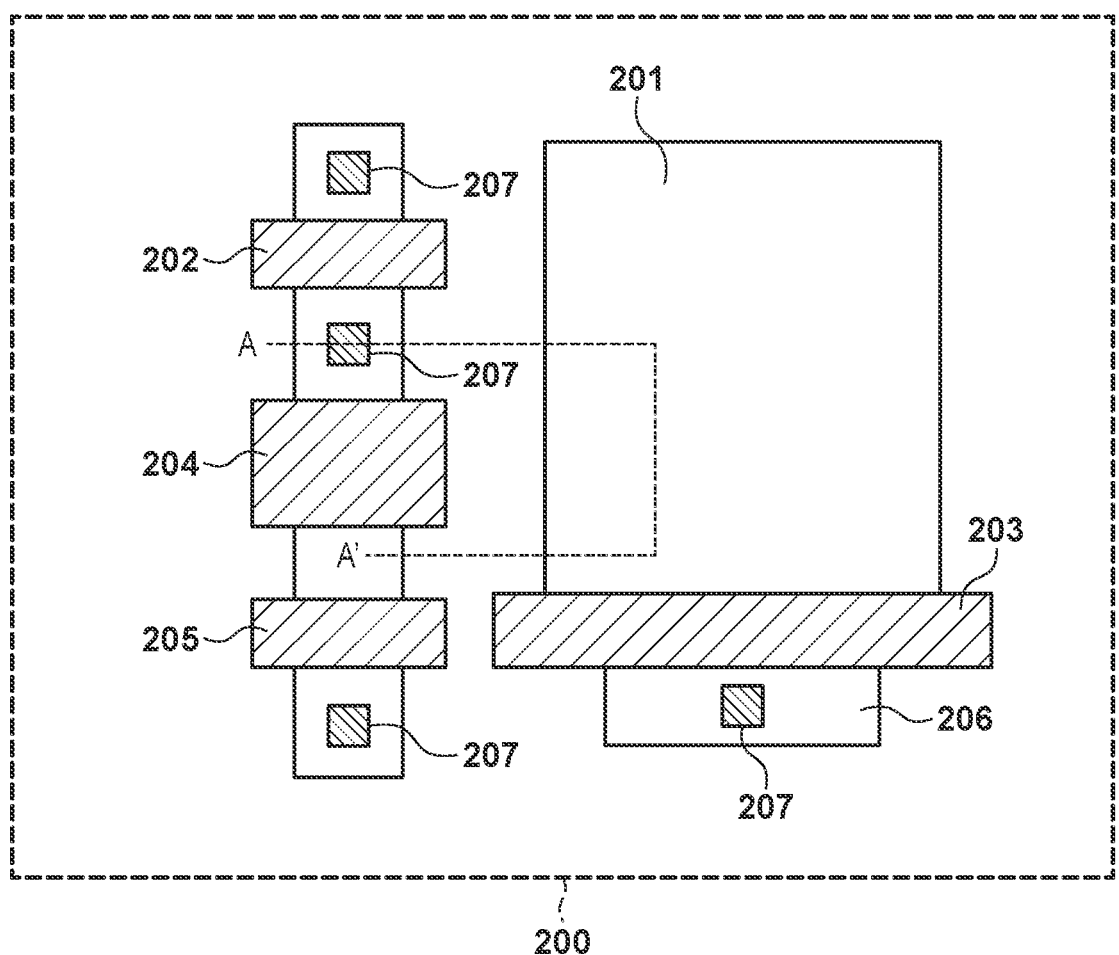
FIG. 2 is a plan view showing an example of the structure of a unit cell of the image capturing device shown in FIG. 1.
Figure 3:
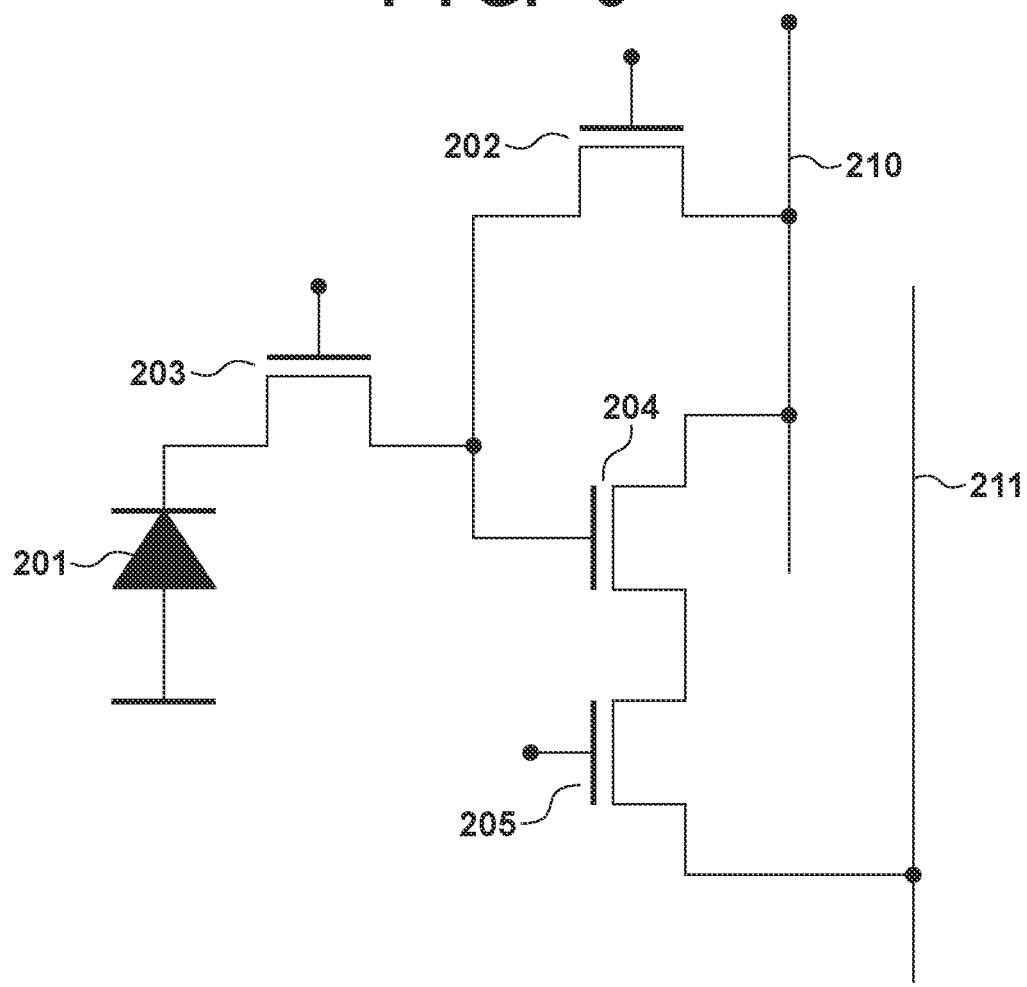
FIG. 3 is an equivalent circuit diagram of the unit cell of the image capturing device shown in FIG. 1.

The structure of an image capturing device according to an embodiment of the present invention will be described with reference to FIGS. 1 to 3. FIGS. 1 and 2 are a sectional view and a plan view, respectively, showing the structure of the image capturing device according to the first embodiment of the present invention. The sectional view of FIG. 1 shows a cross section taken along a broken line A-A' in the plan view of one pixel of the image capturing device shown in FIG. 2. FIG. 3 is an equivalent circuit diagram showing an example of the structure of one pixel of the image capturing device. In this embodiment, the image capturing device in which a unit cell 200 is formed by one pixel and four transistors will be described.

As shown in FIG. 1, a semiconductor region (first semiconductor region) 102 of a p-conductivity type is arranged on a substrate 101 of a semiconductor such as silicon having an n-conductivity type. An n-type semiconductor region 103

(second semiconductor region) whose conductivity type is opposite to that of the p-type semiconductor region 102 and which forms a p-n junction with the p-type semiconductor region 102 and forms a photodiode serving as a photoelectric conversion element is provided in a part of the p-type semiconductor region 102 on the upper surface side. In this specification, "upper" indicates the upper side of the sectional view of FIG. 1. In addition, "lower" indicates the lower side of the sectional view of FIG. 1. For example, "deeper" indicates a much lower side.

In the image capturing device, an embedded insulating film 104 for element isolation is provided to surround the n-type semiconductor region 103. For example, silicon oxide is used for the embedded insulating film 104. The n-type semiconductor region 103 may be formed to extend to a region deeper than the bottom portion of the embedded insulating film 104 for element isolation. When the semiconductor region 103 is arranged up to a deeper portion, more charges can be accumulated.

A semiconductor element can be arranged to be adjacent to the n-type semiconductor region 103 with the intervention of the embedded insulating film 104 for element isolation. The semiconductor element includes, on the side of the obverse surface of the substrate 101, an n-type semiconductor region 112 (third semiconductor region) that forms the source region or drain region of a transistor. Here, the obverse surface of the substrate 101 means the upper-side surface of the substrate 101 in the sectional view of FIG. 1. In an orthogonal projection to the obverse surface of the substrate 101, the above-described embedded insulating film 104 is arranged between the semiconductor region 103 functioning as a photodiode and the semiconductor region 112 of the semiconductor element. The n-type semiconductor region 112 includes a region 109 (first region) and a region 110 (second region), which have n-conductivity type impurity concentrations different from each other. A contact plug (CNT plug) 108 configured to electrically connect a wiring pattern and the semiconductor region 112 is provided on the region 110. That is, the region 110 of the semiconductor region 112 of the semiconductor element contacts a conductor that forms the CNT plug 108 to supply power or a signal. The n-conductivity type impurity concentration in the region 110 is made higher than the n-conductivity type impurity concentration in the region 109 to form an ohmic contact between the region 110 and the CNT plug 108. In the structure shown in FIG. 1, the CNT plug 108 contacts only the region 110 of the semiconductor region 112. However, the CNT plug 108 may contact the region 109. Here, the n (p)-conductivity type impurity concentration is correlated with the number of electrons (holes) generated in a region of interest. For example, if a large amount of n-type impurity and a small amount of p-type impurity exist in the region of interest, the n-conductivity type impurity concentration is represented by the n-type characteristic decided by the difference between the n-type impurity and the p-type impurity. In this embodiment, the semiconductor region 112 forms a part of the transistor but need not always form a part of the transistor. In addition, one semiconductor region 112 sometimes serves as the source regions or drain regions of a plurality of transistors. For this reason, the region including the semiconductor region 112 is sometimes called a semiconductor portion.

The image capturing device includes the above-described embedded insulating film 104 arranged between the semiconductor region 103 functioning as a photodiode and the semiconductor region 112 of the semiconductor element, and a channel stop region 111 that has a p-conductivity type and covers the side and bottom surfaces of the embedded insulating film 104. The channel stop region 111 includes a p-type semiconductor region 105 (fourth semiconductor region) arranged between the embedded insulating film 104 and the semiconductor region 103, and a semiconductor region 106 (fifth semiconductor region) arranged between the embedded insulating film 104 and the semiconductor region 112. Here, the p-conductivity type impurity concentration in the semiconductor region 105 is higher than the p-conductivity type impurity concentration in the semiconductor region 106, and the p-conductivity type impurity concentration in the semiconductor region 106 is equal to or higher than the p-conductivity type impurity concentration in the semiconductor region 102. For example, the p-conductivity type impurity concentration is the highest in the semiconductor region 105, the second highest in the semiconductor region 106, and the lowest in the semiconductor region 102.

The semiconductor region 105 may wholly cover, of the embedded insulating film 104, the bottom surface and the side surface arranged on the side of the semiconductor region 103. As shown in FIG. 1, the semiconductor region 106 may wholly cover, of the embedded insulating film 104, the side surface arranged on the side of the semiconductor region 112. In addition, as shown in FIG. 1, the side and bottom surfaces of the embedded insulating film 104 may wholly be covered by the semiconductor region 105, the semiconductor region 106, and a semiconductor region 107 to be described later.

As shown in FIG. 1, the semiconductor region 105 contacts the embedded insulating film 104 and the semiconductor region 103. Additionally, as shown in FIG. 1, the semiconductor region 106 contacts the embedded insulating film 104 and the semiconductor region 112. As shown in FIG. 1, the semiconductor region 106 contacts the region 109 having a low n-conductivity type impurity concentration and arranged between the semiconductor region 106 and the region 110 of the semiconductor region 112 with a high n-conductivity type impurity concentration.

Furthermore, to suppress generation of a dark current, the p-type semiconductor region 107 (seventh semiconductor region) may be provided between the n-type semiconductor region 103 and the obverse surface of the substrate 101, as shown in FIG. 1. The p-type semiconductor region 107 contacts a portion of the channel stop region 111, which contacts the side surface of the embedded insulating film 104. The p-conductivity type impurity concentration in the p-type semiconductor region 107 is set to be higher than the p-conductivity type impurity concentration in the semiconductor region 105. That is, concerning the p-conductivity type impurity concentrations in the semiconductor regions 102, 105, 106, and 107, a relationship given by semiconductor region 107>semiconductor region 105>semiconductor region 106≥semiconductor region 102 can hold. In the image capturing device according to this embodiment, light to the photodiode enters from the side of the semiconductor region 107 to the semiconductor region 103, as a matter of course.

The structure of one pixel of the image capturing device will be described next. Referring to FIGS. 2 and 3, a photodiode that executes photoelectric conversion is denoted by reference numeral 201. In FIG. 2, a rectangular region representing the photodiode 201 indicates the formation region of the semiconductor region 103 shown in FIG. 1. A region denoted by reference numeral 202 represents the formation position of the gate electrode of the reset transistor 202, and a region denoted by reference numeral 203 represents the formation position of the gate electrode of the transfer transistor 203. A region denoted by reference numeral 204 represents the formation position of the gate electrode of the voltage conversion transistor 204, and a region denoted by reference numeral 205 represents the formation position of the gate electrode of the row selection transistor 205. A region denoted by reference numeral 206 represents the formation position of a floating diffusion (FD) region. A region denoted by reference numeral 207 represents the formation position of the CNT plug. In FIG. 2, a rectangular region representing the CNT plug 207 indicates the CNT plug 108 shown in FIG. 1.

FIG. 3 shows the circuit arrangement of the unit cell 200 that forms a circuit corresponding to one pixel of the image capturing device. A ground potential is given to the anode (p-type semiconductor region 102) of the photodiode 201 configured to perform photoelectric conversion. On the other hand, the cathode (n-type semiconductor region 103) of the photodiode 201 is connected to one terminal of the transfer transistor 203 configured to read out signal charges of the photodiode 201. The other terminal of the transfer transistor 203 is connected to one terminal of the reset transistor 202 configured to reset the photodiode 201 and the FD region 206 and is also connected to the gate of the voltage conversion transistor 204 configured to convert the readout signal charges into a voltage. The voltage conversion transistor 204 operates as a source follower and converts the signal charges read out from the photodiode 201 into a voltage signal, and is connected to the FD region 206 shown in FIG. 2. Both one terminal of the voltage conversion transistor 204 and the other terminal of the reset transistor 202 are connected to a power supply line 210 that gives, for example, a voltage Vdd. The row selection transistor 205 configured to selectively output the output from the voltage conversion transistor 204, that is, the source follower amplifier to a signal line 211 is inserted between the signal line 211 and the other terminal of the voltage conversion transistor 204. As described above, the unit cell 200 may include one photodiode 201 and four transistors.

In this embodiment, the semiconductor region 105 having a p-conductivity type impurity concentration higher than that in the semiconductor region 102 is formed as the channel stop region 111 to cover the side surface of the embedded insulating film 104 for element isolation on the side of the semiconductor region 102 (photodiode 201). To suppress a dark current generated from the interface between the semiconductor region 105 and the side surface of the embedded insulating film 104 on the side of the semiconductor region 102 (photodiode 201), the semiconductor region 105 ensures an impurity concentration necessary for the channel stop region 111. For example, the p-conductivity type impurity concentration necessary for the semiconductor region 105 to suppress the dark current is about $1 \times 10^{14}$ [atoms/cm$^3$]. For example, the p-conductivity type impurity concentration in the semiconductor region 105 may be $5 \times 10^{13}$ [atoms/cm$^3$] (inclusive) to $1 \times 10^{15}$ [atoms/cm$^3$] (inclusive).

On the other hand, the semiconductor region 106 is formed to cover the wall surface of the embedded insulating film 104 on the side of the semiconductor region 112 (semiconductor element) adjacent to the semiconductor region 102 (photodiode 201). This suppresses a dark current generated from the interface at which the embedded insulating film 104 for element isolation contacts the semiconductor region 106, like the semiconductor region 105. At this time, a strong electric field is generated between the semiconductor region 106 and the heavily doped n-type region 110 functioning as the source/drain region of the adjacent semiconductor element or the like. For example, a power supply voltage of 3.0 [V] is applied to the region 110, a ground voltage of 0.0 [V] is applied to the semiconductor region 106, and an electric field is generated between them by the potential difference. For example, when the distance between the photodiode and the semiconductor element, which are adjacent to each other, becomes short along with the progress of miniaturization, the field strength can increase. In general, when the electric field exceeds 200 [kV/cm], a hot carrier is generated by impact ionization. When the hot carrier flows into the semiconductor region 103 that forms the photodiode, a signal output from a pixel becomes large, and a so-called "white defect" occurs. In this embodiment, the impurity concentration in the semiconductor region 106 of the channel stop region 111 is decreased within a range that allows suppression of dark current generation, thereby reducing the electric field generated between the semiconductor region 106 and the region 110 and suppressing occurrence of a white defect. For example, to suppress the electric field generated by a potential difference of 3.0 [V] to 200 [kV/cm] or less, the concentration in the semiconductor region 106 of the channel stop region 111 needs to be decreased to about $1 \times 10^{13}$ [atoms/cm$^3$]. For example, the p-conductivity type impurity concentration in the semiconductor region 106 may be $1 \times 10^{12}$ [atoms/cm$^3$] (inclusive) to $2 \times 10^{14}$ [atoms/cm$^3$] (inclusive).

For example, the p-conductivity type impurity concentration in the semiconductor region 105 of the channel stop region 111 may be $1 \times 10^{14}$ [atoms/cm$^3$], and the p-conductivity type impurity concentration in the semiconductor region 106 may be $1 \times 10^{13}$ [atoms/cm$^3$]. In this way, the p-conductivity type impurity concentration in the semiconductor region 105 may be at least 10 times higher than the p-conductivity type impurity concentration in the semiconductor region 106. Additionally, for example, the p-conductivity type impurity concentration in the semiconductor region 105 of the channel stop region 111 may be $1 \times 10^{14}$ [atoms/cm$^3$], and the p-conductivity type impurity concentration in the semiconductor region 106 may be $2 \times 10^{13}$ [atoms/cm$^3$]. In this way, the p-conductivity type impurity concentration in the semiconductor region 105 may be at least five times higher than the p-conductivity type impurity concentration in the semiconductor region 106. The impurity concentrations of the semiconductor regions 105 and 106 are appropriately decided based on the size or separated distance of photodiodes or semiconductor elements arranged in the image capturing device, and the voltage applied to the photodiodes or semiconductor elements. In addition, the above-described detailed values of the impurity concentrations may be, for example, the maximum impurity concentrations in the semiconductor regions or may be the average impurity concentrations in the semiconductor regions.

In this embodiment, the p-conductivity type impurity concentration in the semiconductor region 106 of the channel stop region 111 is lower than the p-conductivity type impurity concentration in the semiconductor region 105. This makes it possible to simultaneously achieve reduction of the dark current generated in the interface of the embedded insulating film 104 for element isolation by the semiconductor region 105 and suppression of a white defect formed by electric field reduction by the semiconductor region 106. As a result, the quality of an image obtained by the image capturing device according to this embodiment can improve.

Figure 5A:
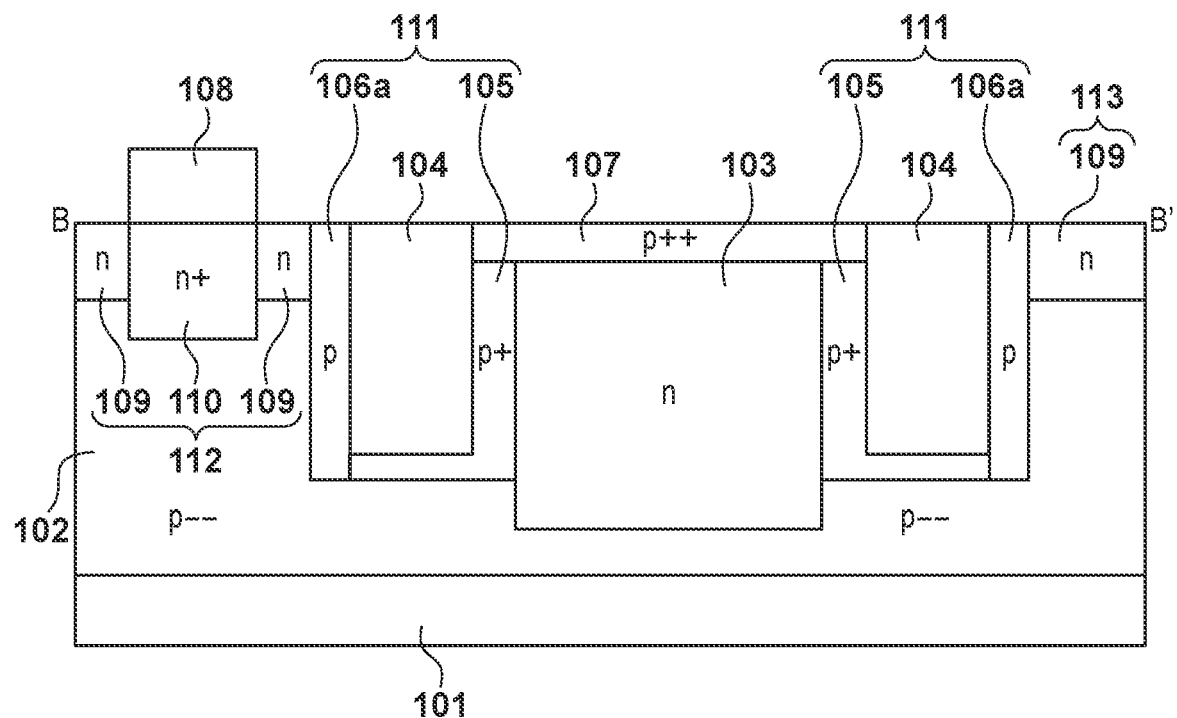
FIGS. 5A and 5B are sectional views showing an example of the structure of the image capturing device shown in FIG. 4.
Figure 5B:
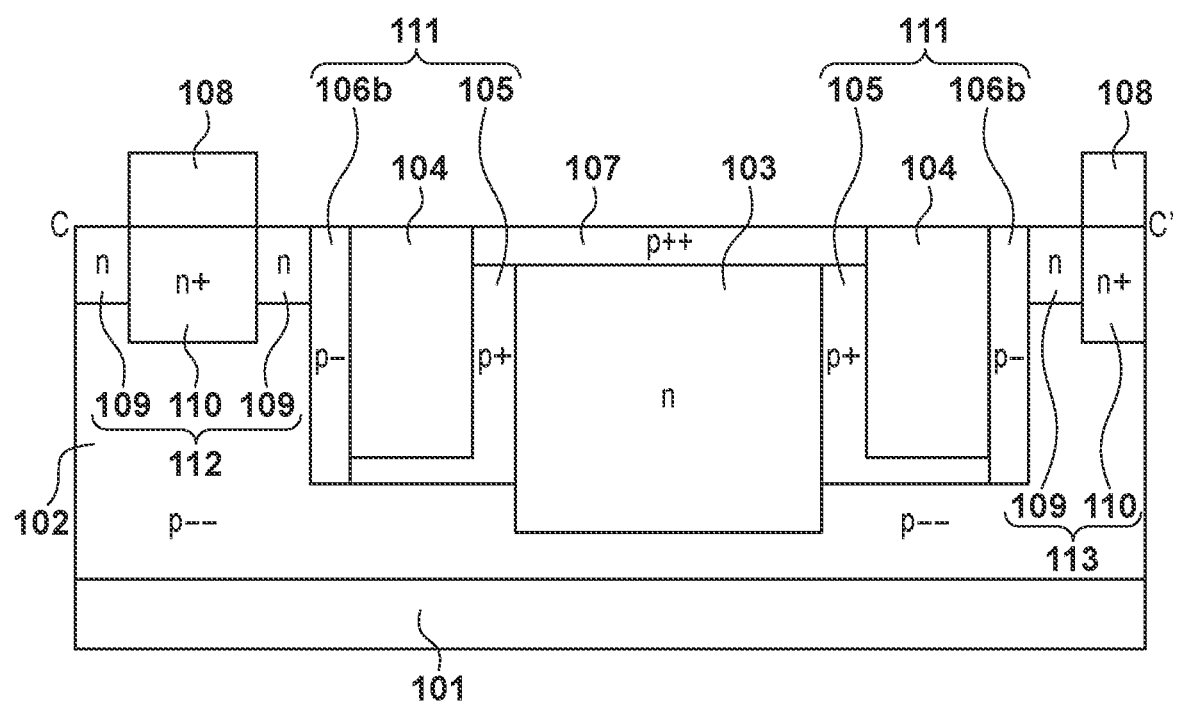

The structure of an image capturing device according to another embodiment of the present invention will be described with reference to FIGS. 4, 5A, and 5B. FIGS. 4, 5A, and 5B are a plan view and sectional views, respectively, showing the structure of the image capturing device according to the second embodiment of the present invention. In this embodiment, a unit cell 200 in which a plurality of photodiodes 201 share transistors such as a reset transistor 202, a voltage conversion transistor 204, and a row selection transistor 205 is arranged in the image capturing device.

In the arrangement shown in FIG. 4, two photodiodes 201, that is, a photodiode 201a and a photodiode 201b share the reset transistor 202, the voltage conversion transistor 204, and the row selection transistor 205. At this time, an n-type semiconductor region 103 of the photodiode 201a and the n-type impurity semiconductor region 103 of the photodiode 201b are arranged side by side in the x direction (first direction), as shown in FIG. 4. In addition, a semiconductor element (first semiconductor portion) arranged in the y direction (second direction) orthogonal to the x direction with respect to the photodiode 201a forms at least parts of the voltage conversion transistor 204 and the row selection transistor 205. Furthermore, a semiconductor element (second semiconductor portion) arranged in the y direction with respect to the photodiode 201b forms at least parts of the reset transistor 202 and the voltage conversion transistor 204.

For this reason, a CNT plug 207 is connected to an n-type semiconductor region 112 on one side of the gate electrode of the row selection transistor 205 adjacent to the photodiode 201a, and the CNT plug 207 is not formed in an n-type semiconductor region 113 (sixth semiconductor region) on the other side. On the other hand, the CNT plugs 207 are connected to the n-type semiconductor regions 112 and 113 on both sides of the gate electrode of the reset transistor 202 adjacent to the photodiode 201b. Hence, as shown in FIG. 4, one CNT plug 207 is adjacent to the photodiode 201a, and two CNT plugs 207 are adjacent to the photodiode 201b.

A heavily doped n-type region 110 of the n-type semiconductor region 112 is arranged under each CNT plug 207 shown in FIG. 4, like the relationship between FIGS. 1 and 2 described above. That is, a region 109 and the region 110 whose n-conductivity type impurity concentration is higher than that in the region 109 are arranged in the semiconductor region 112 of the row selection transistor 205 adjacent to the photodiode 201a. On the other hand, only the region 109 is arranged in the semiconductor region 113 of the row selection transistor 205 adjacent to the photodiode 201a, and the region 110 whose n-conductivity type impurity concentration is higher than that in the region 109 is not arranged. Additionally, the region 109 and the region 110 whose n-conductivity type impurity concentration is higher than that in the region 109 are arranged in the semiconductor regions 112 and 113 of the reset transistor 202 adjacent to the photodiode 201b. Here, the n-conductivity type impurity concentration in the region 109 of the semiconductor region 112 and the n-conductivity type impurity concentration in the region 109 of the semiconductor region 113 can be the same.

As described above, when the transistors are shared by a plurality of pixels, the photodiodes 201 and the adjacent transistors in the unit cell 200 may have different positional relationships or the like. As a result, the numbers of regions 110 adjacent to the photodiodes 201 may be uneven, or a difference may be generated between the voltages applied to the source/drain regions of the transistors. Accordingly, the difference may occur in the characteristic of a white defect between the photodiodes 201a and 201b which share the transistors. A structure that suppresses the difference in the characteristic of the white defect between the photodiode 201a and the photodiode 201b will be described.

In this embodiment, one unit cell 200 is formed by the two photodiodes 201a and 201b and the four types of transistors as in the above-described first embodiment. In FIG. 4, photodiodes that execute photoelectric conversion are denoted by reference numerals 201a and 201b. The photodiodes 201a and 201b share a floating diffusion region to which charges generated by the photodiodes are transferred, and a plurality of transistors. That is, charges generated by the photodiode 201a and charges generated by the photodiode 201b are transferred to the same floating diffusion region in a plurality of floating diffusion regions arranged for each unit cell 200 in the image capturing device. A region denoted by reference numeral 202 represents the formation position of the gate electrode of the reset transistor 202, and a region denoted by reference numeral 203 represents the formation position of the gate electrode of the transfer transistor 203. A region denoted by reference numeral 204 represents the formation position of the gate electrode of the voltage conversion transistor 204, and a region denoted by reference numeral 205 represents the formation position of the gate electrode of the row selection transistor 205. A region denoted by reference numeral 206 represents the formation position of a floating diffusion (FD) region. A region denoted by reference numeral 207 represents the formation position of the CNT plug.

FIGS. 5A and 5B show sectional views taken along a line B-B' and a line C-C' in FIG. 4, respectively. FIG. 5A shows a cross section in a case in which one heavily doped region 110 in the semiconductor region 112 of the semiconductor element is adjacent to the semiconductor region 103 (photodiode 201a). In addition, FIG. 5B shows a cross section in a case in which two heavily doped regions 110 in the semiconductor region 112 of the semiconductor element are adjacent to the semiconductor region 103 (photodiode 201b). Each of the cross sections of the image capturing device shown in FIGS. 5A and 5B has the same structure as the cross section shown in FIG. 1 of the above-described first embodiment. However, in a channel stop region 111, the impurity concentrations in the semiconductor regions 106 each covering the side surface of the embedded insulating film 104 on the side of the semiconductor element (semiconductor region 112) are different from each other on the cross sections represented by the line B-B' and the line C-C' in FIG. 4. More specifically, the p-conductivity type impurity concentration in a semiconductor region 106b is equal to or higher than the p-conductivity type impurity concentration in the semiconductor region 102 and lower than the p-conductivity type impurity concentration in a semiconductor region 106a. The rest of the structure may be the same as in the above-described first embodiment. That is, concerning the p-conductivity type impurity concentrations in the semiconductor regions 102, 105, 106a, 106b, and 107, a relationship given by semiconductor region 107>semiconductor region 105>semiconductor region 106a>106b≥semiconductor region 102 can hold.

In this embodiment, the semiconductor region 105 having a p-conductivity type impurity concentration higher than that in the semiconductor region 102 is formed as the channel stop region 111 to cover the side surface of the embedded insulating film 104 for element isolation on the side of the semiconductor region 102 (photodiode 201). A dark current generated from the interface between the semiconductor region 105 and the side surface of the embedded insulating film 104 on the side of the semiconductor region 102 (photodiode 201) is suppressed by the semiconductor region 105, as in the above-described first embodiment.

On the other hand, each of the semiconductor regions 106a and 106b is formed to cover the wall surface of the embedded insulating film 104 on the side of the semiconductor region 112 (semiconductor element) adjacent to the semiconductor region 102 (photodiode 201). This suppresses a dark current generated from the interface at which the embedded insulating film 104 for element isolation contacts the semiconductor region 106, like the semiconductor region 105. Additionally, as in the above-described first embodiment, the impurity concentration in each of the semiconductor regions 106a and 106b is made lower than that in the semiconductor region 105, thereby reducing the electric field between the semiconductor region 106a or 106b and the region 110 and suppressing occurrence of a white defect. At this time, the relationship between the p-conductivity type impurity concentration in the semiconductor region 106a and the p-conductivity type impurity concentration in the semiconductor region 106b is adjusted in accordance with the number of CNT plugs 108 (207) adjacent to each of the photodiodes 201a and 201b. In the structure shown in FIGS. 4, 5A, and 5B, the impurity concentration in the semiconductor region 106b is set to be lower than the impurity concentration in the semiconductor region 106a. The electric field generated between the semiconductor region 106a or 106b and the heavily doped region 110 that exists in the semiconductor region 112 of the semiconductor element (transistor) adjacent to the photodiode 201a or 201b is thus adjusted. The impurity concentration in the semiconductor region 106 covering the side of the semiconductor region 112 in the channel stop region 111 is changed by the structure of the semiconductor element (transistor) adjacent to the photodiode 201. Accordingly, even in a case in which the plurality of photodiodes 201 share the transistors, it is possible to reduce the difference in the characteristic of a white defect by impact ionization caused by the electric field derived from the arrangement of the semiconductor element (transistor).

Figure 7A:
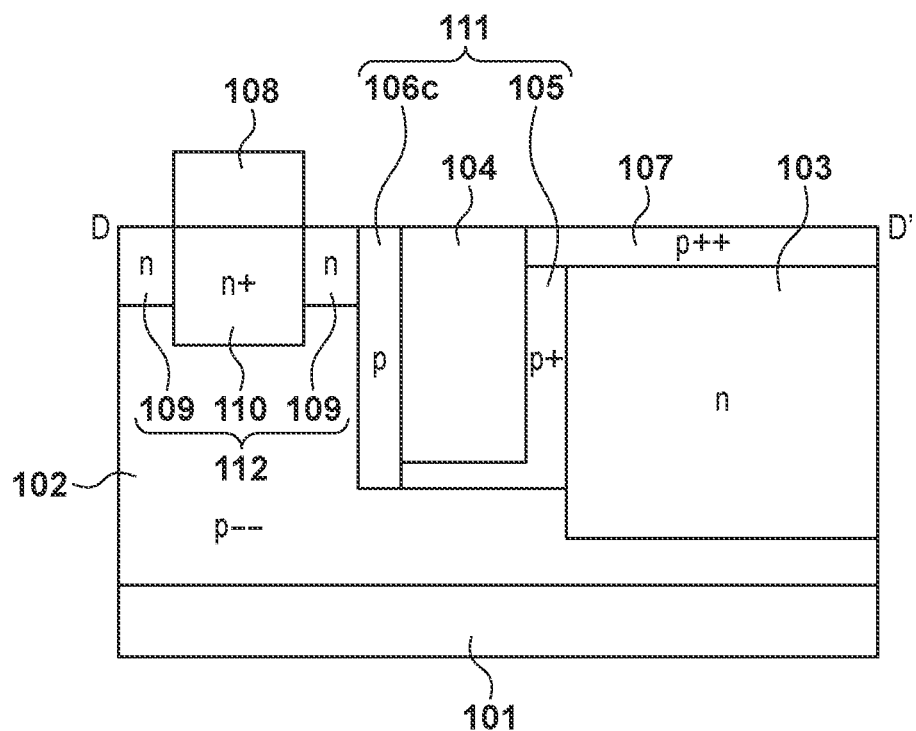
FIGS. 7A and 7B are sectional views showing an example of the structure of the image capturing device shown in FIG. 6.
Figure 7B:
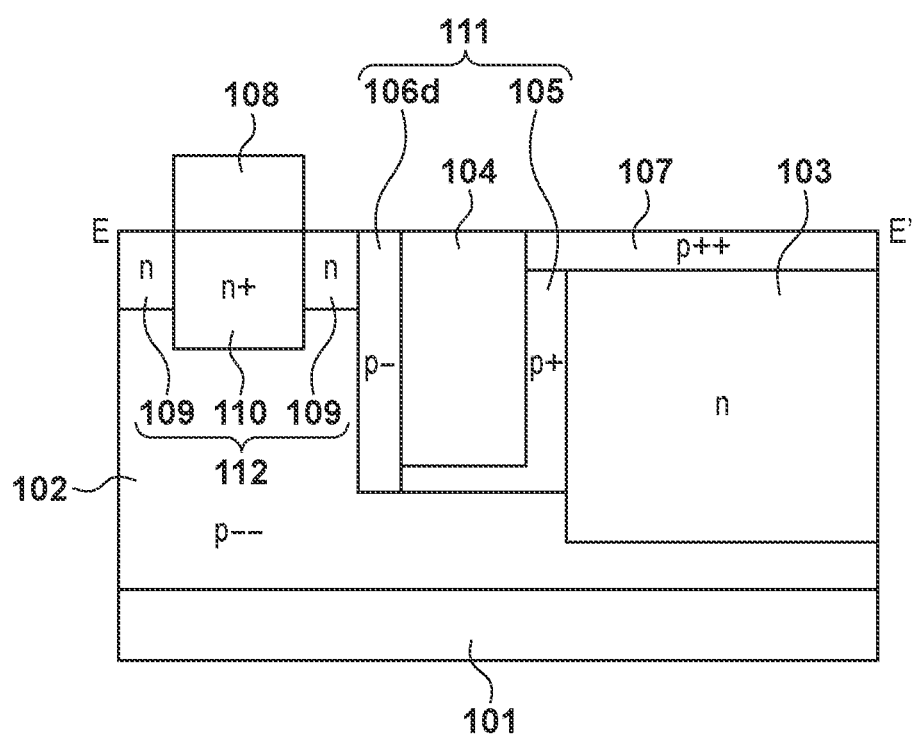

The structure of an image capturing device according to still another embodiment of the present invention will be described with reference to FIGS. 6, 7A, and 7B. FIGS. 6, 7A, and 7B are a plan view and sectional views, respectively, showing the structure of the image capturing device according to the third embodiment of the present invention. In this embodiment, a unit cell 200 in which a plurality of photodiodes 201 share an FD region 206, and transistors such as a reset transistor 202, a voltage conversion transistor 204, and a row selection transistor 205 is arranged in the image capturing device. In this embodiment, the image capturing device can be an image capturing device that performs focus detection of a phase difference method by collecting light to the plurality of photodiodes 201 using one microlens. To do this, the image capturing device further includes, above a substrate 101, a plurality of microlenses (not shown) configured to collect light. The microlens can be arranged for each unit cell 200. Light collected by the same microlens in the plurality of microlenses enters a photodiode 201c and a photodiode 201d of the same unit cell 200.

In the arrangement shown in FIG. 6, two photodiodes 201, that is, the photodiode 201c and the photodiode 201d share the reset transistor 202, the voltage conversion transistor 204, and the row selection transistor 205. At this time, an n-type semiconductor region 103 of the photodiode 201c and the n-type impurity semiconductor region 103 of the photodiode 201d are arranged side by side in the x direction, as shown in FIG. 6. In addition, a semiconductor element arranged in the y direction orthogonal to the x direction with respect to the photodiode 201c forms at least parts of the voltage conversion transistor 204 and the row selection transistor 205. Furthermore, a semiconductor element arranged in the y direction with respect to the photodiode 201d forms at least parts of the reset transistor 202 and the voltage conversion transistor 204.

For this reason, a CNT plug 207 is connected to an n-type semiconductor region 112 on one side of the gate electrode of the row selection transistor 205 adjacent to the photodiode 201c, and the CNT plug 207 is not formed in an n-type semiconductor region 113 on the other side. On the other hand, the CNT plugs 207 are connected to the n-type semiconductor regions 112 and 113 on both sides of the gate electrode of the reset transistor 202 adjacent to the photodiode 201d. Hence, as shown in FIG. 6, one CNT plug 207 is adjacent to the photodiode 201c, and two CNT plugs 207 are adjacent to the photodiode 201d.

A heavily doped n-type region 110 of the n-type semiconductor region 112 is arranged under each CNT plug 207 shown in FIG. 6, like the relationships between FIG. 1 and FIG. 2 and the relationship between FIGS. 4, 5A, and 5B described above. For this reason, as in the above-described second embodiment, the photodiodes 201 and the adjacent transistors in the unit cell 200 may have different positional relationships or the like. As a result, the numbers of regions 110 adjacent to the photodiodes 201 may be uneven, or a difference may be generated between the voltages applied to the source/drain regions of the transistors. Accordingly, the difference may occur in the characteristic of a white defect between the photodiodes 201c and 201d which share the transistors. A structure that suppresses the difference in the characteristic of the white defect between the photodiode 201c and the photodiode 201d will be described.

In this embodiment, as in the above-described second embodiment, one unit cell 200 is formed by the two photodiodes 201c and 201d and the four types of transistors. In FIG. 6, photodiodes that execute photoelectric conversion are denoted by reference numerals 201c and 201d. The photodiodes 201c and 201d share a plurality of transistors. In addition, light that has passed through the same microlens enters the photodiodes 201c and 201d, as described above. In addition, the photodiodes 201c and 201d may share an FD region 206, as shown in FIG. 6. A region denoted by reference numeral 202 represents the formation position of the gate electrode of the reset transistor 202, and a region denoted by reference numeral 203 represents the formation position of the gate electrode of the transfer transistor 203. A region denoted by reference numeral 204 represents the formation position of the gate electrode of the voltage conversion transistor 204, and a region denoted by reference numeral 205 represents the formation position of the gate electrode of the row selection transistor 205. A region denoted by reference numeral 206 represents the formation position of a floating diffusion (FD) region. A region denoted by reference numeral 207 represents the formation position of the CNT plug.

FIGS. 7A and 7B show sectional views taken along a line D-D' and a line E-E in FIG. 6, respectively. FIG. 7A shows a cross section in a case in which one heavily doped region 110 in the semiconductor region 112 of the semiconductor element is adjacent to the semiconductor region 103 (photodiode 201c). In addition, FIG. 7B shows a cross section in a case in which two heavily doped regions 110 in the semiconductor region 112 of the semiconductor element are adjacent to the semiconductor region 103 (photodiode 201d). Each of the cross sections of the image capturing device shown in FIGS. 7A and 7B has the same structure as the cross section shown in FIG. 1 of the above-described first embodiment. However, as in the second embodiment, in a channel stop region 111, the impurity concentrations in the semiconductor regions 106 each covering the side surface of the embedded insulating film 104 on the side of the semiconductor element (semiconductor region 112) are different from each other on the cross sections represented by the line D-D' and the line E-E in FIG. 6. More specifically, the p-conductivity type impurity concentration in a semiconductor region 106d (eighth semiconductor region) is equal to or higher than the p-conductivity type impurity concentration in the semiconductor region 102 and lower than the p-conductivity type impurity concentration in a semiconductor region 106c. The rest of the structure may be the same as in the above-described first embodiment. That is, concerning the p-conductivity type impurity concentrations in the semiconductor regions 102, 105, 106c, 106d, and 107, a relationship given by semiconductor region 107>semiconductor region 105>semiconductor region 106c>106d≥semiconductor region 102 can hold.

In this embodiment, the semiconductor region 105 having a p-conductivity type impurity concentration higher than that in the semiconductor region 102 is formed as the channel stop region 111 to cover the side surface of the embedded insulating film 104 for element isolation on the side of the semiconductor region 102 (photodiode 201). A dark current generated from the interface between the semiconductor region 105 and the side surface of the embedded insulating film 104 on the side of the semiconductor region 102 (photodiode 201) is suppressed by the semiconductor region 105, as in the above-described first embodiment.

On the other hand, each of the semiconductor regions 106c and 106d is formed to cover the wall surface of the embedded insulating film 104 on the side of the semiconductor region 112 (semiconductor element) adjacent to the semiconductor region 102 (photodiode 201). This suppresses a dark current generated from the interface at which the embedded insulating film 104 for element isolation contacts the semiconductor region 106, like the semiconductor region 105. Additionally, as in the above-described first embodiment, the impurity concentration in each of the semiconductor regions 106c and 106d is made lower than that in the semiconductor region 105, thereby reducing the electric field between the semiconductor region 106c or 106d and the region 110 and suppressing occurrence of a white defect. At this time, the relationship between the p-conductivity type impurity concentration in the semiconductor region 106c and the p-conductivity type impurity concentration in the semiconductor region 106d is adjusted in accordance with the number of CNT plugs 108 (207) adjacent to each of the photodiodes 201c and 201d. In the structure shown in FIGS. 6, 7A, and 7B, the impurity concentration in the semiconductor region 106d is set to be lower than the impurity concentration in the semiconductor region 106c. The electric field generated between the semiconductor region 106c or 106d and the heavily doped region 110 that exists in the semiconductor region 112 of the semiconductor element (transistor) adjacent to the photodiode 201c or 201d is thus adjusted. The impurity concentration in the semiconductor region 106 covering the side of the semiconductor region 112 in the channel stop region 111 is changed by the structure of the semiconductor element (transistor) adjacent to the photodiode 201. Accordingly, even in a case in which the plurality of photodiodes 201 share one microlens for phase difference detection, it is possible to reduce the difference in the characteristic of a white defect by impact ionization caused by the electric field derived from the arrangement of the semiconductor element (transistor).

The embodiments according to the present invention have been described above. However, the present invention is not limited to these embodiments, as a matter of course, and the above-described embodiments can appropriately be changed or combined without departing from the scope of the present invention.

For example, as shown in FIG. 8, the arrangement of the region 109 and the region 110 of the n-type semiconductor region 112 may be different from the arrangement shown in FIGS. 1, 5A, 5B, 7A, and 7B. In the arrangement shown in FIG. 8, the relationship between the region 109 and the region 110 of the semiconductor region 112 in the depth direction is different from that in the above-described embodiments. In the above-described embodiments, the depth to arrange the bottom surface of the region 109 is shallower than the depth to arrange the bottom surface of the region 110. On the other hand, in the arrangement shown in FIG. 8, the region 109 covers the side and bottom surfaces of the region 110. For example, in the relationship of the peak positions of the n-conductivity type impurity concentrations in the semiconductor region 112, the peak position of the n-conductivity type impurity concentration in the region 110 may be formed at a shallower position as compared to the peak position of the n-conductivity type impurity concentration in the region 109. When the region 110 is covered by the region 109 with a lower impurity concentration, the region 109 reliably exists between the region 110 and the semiconductor region 106. This makes the potential change moderate and reduces the electric field. When the electric field is reduced, the white defect by impact ionization derived from the electric field generated between the semiconductor region 106 and the region 110 is suppressed.

Additionally, in the above-described embodiments, the semiconductor regions 102, 105, and 106 have been described as semiconductor regions of a p-conductivity type, and the semiconductor regions 103, 112, and 113 have been described as semiconductor regions of an n-conductivity type. However, the present invention is not limited to this, and the semiconductor regions 102, 105, and 106 may be semiconductor regions of an n-conductivity type, and the semiconductor regions 103, 112, and 113 may be semiconductor regions of a p-conductivity type.

As an application example of the image capturing device according to each of the above-described embodiments, a camera incorporating the image capturing device will exemplarily be described. The concept of the camera includes not only apparatuses mainly aiming at shooting but also apparatuses (personal computer, portable terminal, and the like) having an auxiliary shooting function. The camera includes the image capturing device according to the present invention exemplified as the above-described embodiments, and a signal processing unit configured to process information based on a signal output from the image capturing device. The signal processing unit can include a processor configured to process digital data that is image data. The processor can perform processing of calculating a defocus amount based on a signal from a pixel of the image capturing device, which has a focus detection function, and controlling focus adjustment of a photographing lens based on the defocus amount. An A/D converter that generates the image data can be provided in the image capturing device or can be provided independently of the image capturing device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-027248, filed Feb. 19, 2018, which is hereby incorporated by reference herein in its entirety.

What is claimed is:

1. An image capturing device comprising:
   a photodiode including a first semiconductor region of a first conductivity type, and a second semiconductor region of a second conductivity type opposite to the first conductivity type, which are arranged on a substrate;
   a reset transistor configured to reset the photodiode;
   a voltage conversion transistor configured to convert signal charges generated by the photodiode into a voltage signal;
   a third semiconductor region of the second conductivity type forming a source region or a drain region of at least one of the reset transistor or the voltage conversion transistor;
   an embedded insulating film arranged between the photodiode and the third semiconductor region in an orthogonal projection to an obverse surface of the substrate; and
   a channel stop region of the first conductivity type which covers a side surface and a bottom surface of the embedded insulating film,
   wherein the channel stop region includes, in a cross section passing between the photodiode and the third semiconductor region, (a) a fourth semiconductor region arranged between the embedded insulating film and the second semiconductor region, and (b) a fifth semiconductor region arranged between the embedded insulating film and the third semiconductor region,
   wherein an impurity concentration of the first conductivity type in the fourth semiconductor region is higher than an impurity concentration of the first conductivity type in the fifth semiconductor region,
   wherein the impurity concentration of the first conductivity type in the fifth semiconductor region is not less than an impurity concentration of the first conductivity type in the first semiconductor region, and
   wherein the fifth semiconductor region does not include a portion extending along a bottom surface of the third semiconductor region.

2. The device according to claim 1, wherein the fourth semiconductor region wholly covers, of the embedded insulating film, the bottom surface and the side surface arranged on a side of the second semiconductor region.

3. The device according to claim 1, wherein the fifth semiconductor region wholly covers, of the embedded insulating film, the side surface arranged on a side of the third semiconductor region.

4. The device according to claim 1, wherein the fifth semiconductor region contacts the embedded insulating film and the third semiconductor region.

5. The device according to claim 1, wherein the third semiconductor region includes a first region and a second region, whose impurity concentrations of the second conductivity type are different from each other.

6. The device according to claim 5, wherein an impurity concentration of the second conductivity type in the first region of the third semiconductor region is lower than an impurity concentration of the second conductivity type in the second region of the third semiconductor region, and
   wherein the first region of the third semiconductor region is arranged between the fifth semiconductor region and the second region of the third semiconductor region.

7. The device according to claim 6, wherein a depth to arrange a bottom surface of the first region of the third semiconductor region is shallower than a depth to arrange a bottom surface of the second region of the third semiconductor region.

8. The device according to claim 6, wherein the first region of the third semiconductor region covers a side surface and a bottom surface of the second region of the third semiconductor region.

9. The device according to claim 6, wherein the second region of the third semiconductor region contacts a conductor.

10. The device according to claim 6, wherein the image capturing device includes a plurality of photodiodes including the photodiode, and a plurality of semiconductor portions each including the third semiconductor region,
    wherein the plurality of photodiodes include a first photodiode and a second photodiode, each of which includes the second semiconductor region,
    wherein the second semiconductor region of the first photodiode and the second semiconductor region of the second photodiode are arranged side by side in a first direction,
    wherein the plurality of semiconductor portions include a first semiconductor portion arranged in a second direction orthogonal to the first direction with respect to the first photodiode, and a second semiconductor portion arranged in the second direction with respect to the second photodiode,
    wherein each of the first semiconductor portion and the second semiconductor portion includes the third semiconductor region and a sixth semiconductor region of the second conductivity type arranged in the first direction with respect to the third semiconductor region,
    wherein a third region whose impurity concentration of the second conductivity type equals that in the first region of the third semiconductor region is arranged in the sixth semiconductor region of the first semiconductor portion,
    wherein the sixth semiconductor region of the second semiconductor portion includes a fourth region whose impurity concentration of the second conductivity type equals that in the first region of the third semiconductor region, and a fifth region whose impurity concentration of the second conductivity type is higher than that in the fourth region, and
    wherein an impurity concentration of the first conductivity type in the fifth semiconductor region of the channel stop region arranged between the second photodiode and the second semiconductor portion is lower than an impurity concentration of the first conductivity type in the fifth semiconductor region of the channel stop region arranged between the first photodiode and the first semiconductor portion.

11. The device according to claim 10, further comprising a plurality of floating diffusion regions to which charges generated by the plurality of photodiodes are transferred,
    wherein charges generated by the first photodiode and charges generated by the second photodiode are transferred to a same floating diffusion region in the plurality of floating diffusion regions.

12. The device according to claim 10, further comprising a plurality of microlenses configured to collect light,
wherein light collected by a same microlens in the plurality of microlenses enters the first photodiode and the second photodiode.

13. The device according to claim 10, wherein the second semiconductor portion forms at least parts of the reset transistor, which is configured to reset the first photodiode and the second photodiode, and the voltage conversion transistor, which is configured to convert signal charges generated by the first photodiode and the second photodiode into a voltage signal, and
wherein the first semiconductor portion forms at least parts of the voltage conversion transistor, and a row selection transistor configured to output the voltage signal.

14. The device according to claim 1, wherein a contact plug contacts the third semiconductor region.

15. The device according to claim 1, wherein the third semiconductor region forms one of a source region and a drain region of a transistor.

16. The device according to claim 1, wherein the impurity concentration of the first conductivity type in the fourth semiconductor region is at least five times higher than the impurity concentration of the first conductivity type in the fifth semiconductor region.

17. The device according to claim 1, further comprising a seventh semiconductor region of the first conductivity type between the second semiconductor region and the obverse surface of the substrate, and
wherein an impurity concentration of the first conductivity type in the seventh semiconductor region is higher than the impurity concentration of the first conductivity type in the fourth semiconductor region.

18. A camera comprising:
an image capturing device according to claim 1; and
a signal processing unit configured to process a signal obtained by the image capturing device.

19. The device according to claim 1, wherein the third semiconductor region and the fifth semiconductor region do not overlap and do not contact in the orthogonal projection to the obverse surface of the substrate.

20. The device according to claim 1, wherein in a cross-sectional view, the fourth semiconductor region and the fifth semiconductor region are in contact with each other.

* * * * *